United States Patent [19]

Sheu et al.

[11] Patent Number: 4,840,918

[45] Date of Patent: * Jun. 20, 1989

[54] METHOD OF NOISE REDUCTION IN CCD SOLID STATE IMAGERS

[75] Inventors: Yea-Dean Sheu, Rochester; Gilbert Hawkins, Pittsford, both of N.Y.

[73] Assignee: Eastman Kodak Company, Rochester, N.Y.

[*] Notice: The portion of the term of this patent subsequent to Jun. 20, 2006 has been disclaimed.

[21] Appl. No.: 191,526

[22] Filed: May 9, 1988

[51] Int. Cl.$^4$ .................. H01L 21/00; H01L 21/02; H01L 21/477; H01L 31/00
[52] U.S. Cl. .................................. 437/53; 437/10; 437/12; 437/13; 437/247; 437/2
[58] Field of Search ................. 437/10, 12, 13, 941

[56] References Cited

U.S. PATENT DOCUMENTS 3,923,559  12/1975  Sinha .................................. 437/941

FOREIGN PATENT DOCUMENTS 2056174  8/1980  United Kingdom ............... 437/941
2140202  11/1984  United Kingdom ............... 437/941

Primary Examiner—Brian E. Hearn
Assistant Examiner—B. Everhart
Attorney, Agent, or Firm—Raymond L. Owens

[57] ABSTRACT

A method to reduce the dark current in CCD solid state imagers is disclosed. This method involves sintering an unpatterned Al film on top of an oxide layer at 450° C. for a time to generate sufficient numbers of atomic hydrogen atoms to diffuse through the oxide layer and passivate the silicon surface states.

3 Claims, 2 Drawing Sheets

METHOD OF NOISE REDUCTION IN CCD SOLID STATE IMAGERS

FIELD OF THE INVENTION

This invention relates to CCD solid state imagers, Charge Couple Devices, and more particularly to a method to reduce the noise in such CCD's.

BACKGROUND OF THE INVENTION

Dark current from the surface state, of a silicon wafer is a dominate noise source in solid state imagers. Surface states can be passivated by hydrogen in molecular or atomic form. Atomic hydrogen is more effective in passivating the surface state than molecular hydrogen. Atomic hydrogen can be introduced into the oxide through hydrogen ion implantation or from hydrogenated amorphous Si gate electrodes. However, these approaches have problems such as process-induced radiation damages and complexities in setting up the process.

SUMMARY OF THE INVENTION

The present invention provides a new method to introduce atomic hydrogen into the oxide to reduce dark current. This mehtod involves deposition of a sacrificial Al film on top of an encapsulation oxide layer on the CCD followed by annealing at 450° C. for 30 minutes and a wet Al etch off step. Al reacts with the trace water at the Al/oxide interface and release atomic hydrogen which migrate to the $Si/SiO_2$ interface to passivate the surface states of the silicon. In the conventional process of Si device fabrication, sintering is performed with Al being patterned as the final step. In this case, the amount of Al in or near the device active area is typically small and sintering results in only minor passivation. Until this invention there has been no recognition that sintering of unpatterned aluminum could be used to provide significant passivation in CCDs.

MODES OF CARRYING OUT THE INVENTION

Figure 1:
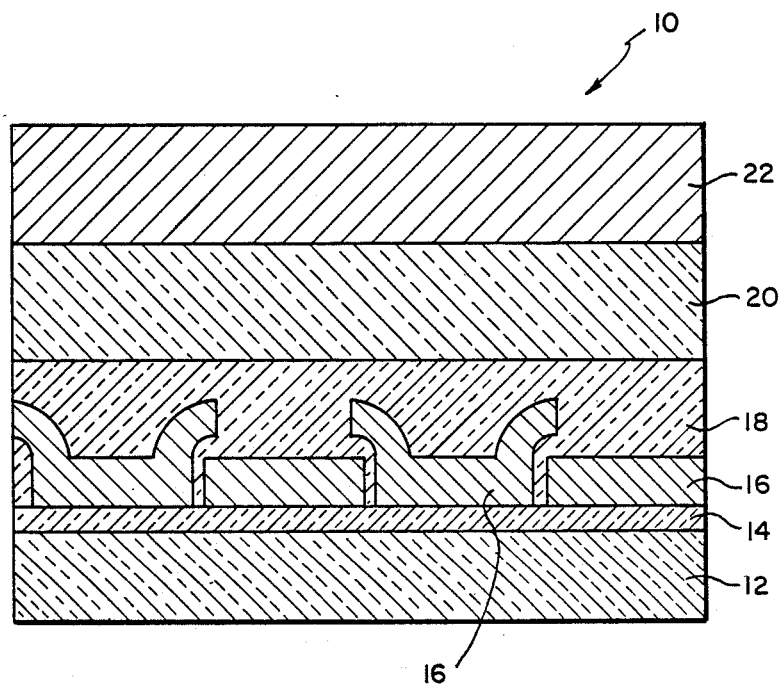
FIG. 1 shows the device structure during one portion of a sintering step.

Referring to FIG. 1, the active area of a CCD 10 is shown. It has six layers. Layer 12 is a silicion substrate. Gate oxide layer 14 is thermally grown from the substrate; layer 16 are patterned polysilicon gate electrodes; layer 18 is a Chemical Vapor Deposition (CVD) oxide film, layer 20 is an encapsulation layer composed of 7000 Å CVD oxide. Up to this point, the process is conventional. In accordance with the method of this invention, a sacrificial blanket Al film or layer 22 is deposited on top of the encapsulation layer. The Al layer is typically 5000 Å to 1 μm thick. The CVD oxide film is exposed to atmospheric moisture during transfer from the oxide deposition equipment to the Al deposition equipment. Trace water may be incorporated in the CVD oxide during this time. Then the CCD is sintered at 450° C. for 30 minutes. The sintering ambient can be N2 or 10% H2 in N2. The Al is then completely etched off by a standard wet etch with phosphoric acid. The result of the above process is that the gate oxide/silicon interface in the active device area is passivated.

Figure 2:
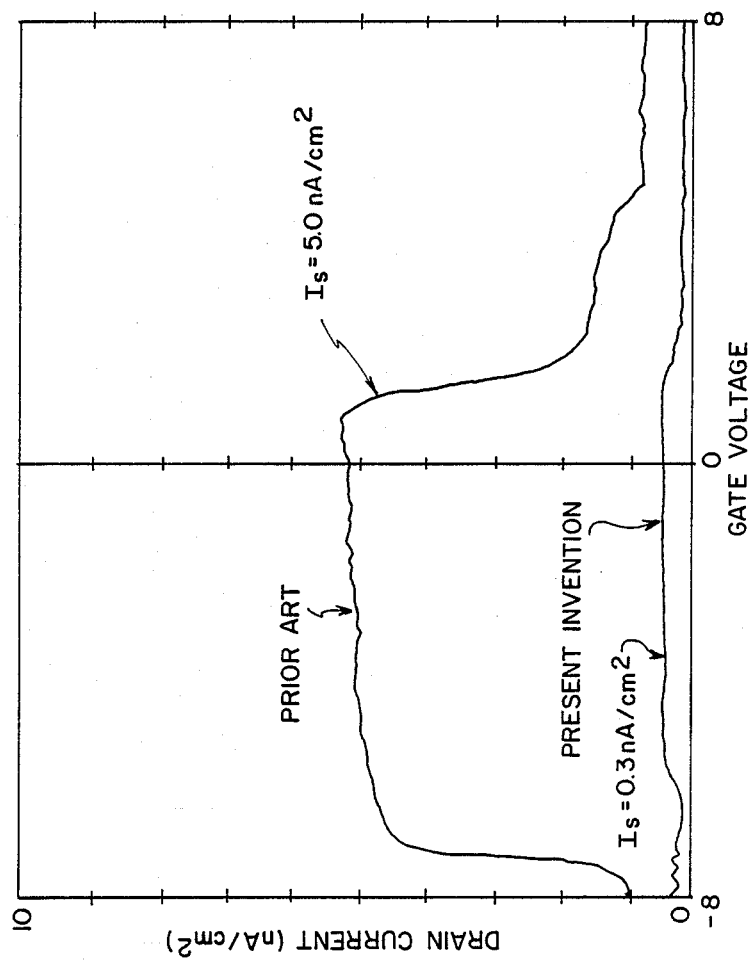
FIG. 2 is a graph which compares the dark current with and without using the method of FIG. 1.

As shown in FIG. 2, the resultant surface dark current measured from test structure adjacent to the CCD is 0.3 $nA/cm^2$ as opposed to 5 $nA/cm^2$ with prior art processes. Dark current measured from CCD imagers also show similar degree of reduction. It is believed that dark current reduction occurs due to the production of atomic hydrogen released from the Al/oxide interface during reaction between Al oxide and trace water in the oxide and that hydrogen diffuses through the oxide and polysilicon gates to the active interface to annihilate interface states.

Advantages

In order to passivate surface states, the invention only requires minor changes in conventional processes without experimentation, setting up procedures, equipment and/or processes as needed in the other methods. The invention is also free from the radiation damage which is inherent in other methods.

The invention has been described in detail with particular reference to preferred embodiments thereof, but it will be understood that variations and modifications can be effected within the spirit and scope of the invention.

We claim:

1. A method of passivating the surface states of an active layer in a solid state device comprising the steps of:
   (a) forming an unpatterned Al layer over an oxide layer of the device having trace water;
   (b) sintering the unpatterned Al layer to generate sufficient hydrogen atoms from trace water in the oxide layer to passivate surface states on the gate oxide/silicon interface in the device active areas.

2. A method of passivating the surface states of a silicon layer of a CCD solid state imager, comprising the steps of:
   (a) forming a blanket Al layer over an oxide layer of the CCD so that the Al layer is in contact with trace water in an underlying layer; and
   (b) sintering the Al film at a temperature selected so that sufficient numbers of hydrogen atoms from the trace water are formed and they diffuse through the oxide layer to passivate the surface states of the silicon layer.

3. The method of claim 2 wherein the sintering temperature is 450° C.

* * * * *